(12) United States Patent
Tanaka

(10) Patent No.: US 7,609,107 B2
(45) Date of Patent: Oct. 27, 2009

(54) SEMICONDUCTOR INTEGRATED CIRCUIT AND ACTIVATION METHOD OF THE SAME

(75) Inventor: Yoshinori Tanaka, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/155,282

(22) Filed: Jun. 2, 2008

(65) Prior Publication Data

US 2009/0027114 A1     Jan. 29, 2009

(30) Foreign Application Priority Data

Jul. 24, 2007    (JP)  .............................. 2007-192252

(51) Int. Cl.
*G05F 1/10*     (2006.01)
*G05F 3/02*     (2006.01)

(52) U.S. Cl. ......................................... 327/544; 326/33
(58) Field of Classification Search .................. 327/544; 326/33, 95–97
See application file for complete search history.

(56) References Cited

U.S. PATENT DOCUMENTS

2004/0130387 A1 *   7/2004   Marshall ...................... 327/544
2008/0278194 A1 *   11/2008   Kamo et al. .................. 326/33

FOREIGN PATENT DOCUMENTS

JP             06-029834       2/1994

* cited by examiner

*Primary Examiner*—Quan Tra
(74) *Attorney, Agent, or Firm*—Rader, Fishman & Grauer PLLC

(57) ABSTRACT

Disclosed herein is a semiconductor integrated circuit including, a circuit section, a first voltage line, a second voltage line, a third voltage line, a switch section, and a control section.

4 Claims, 6 Drawing Sheets

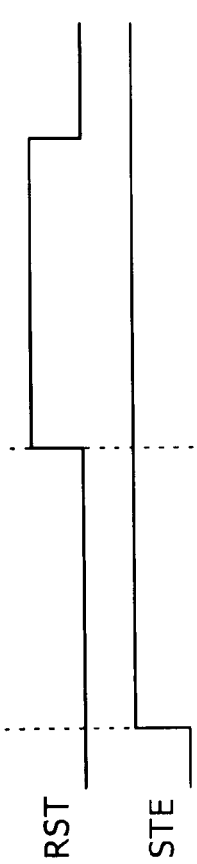
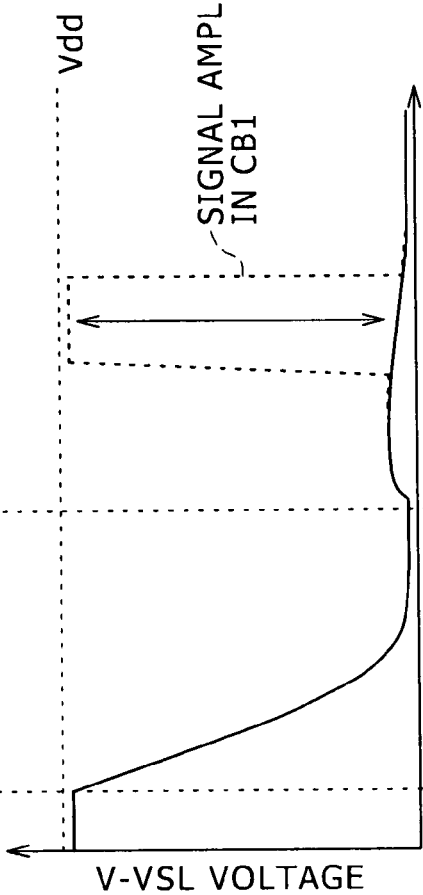
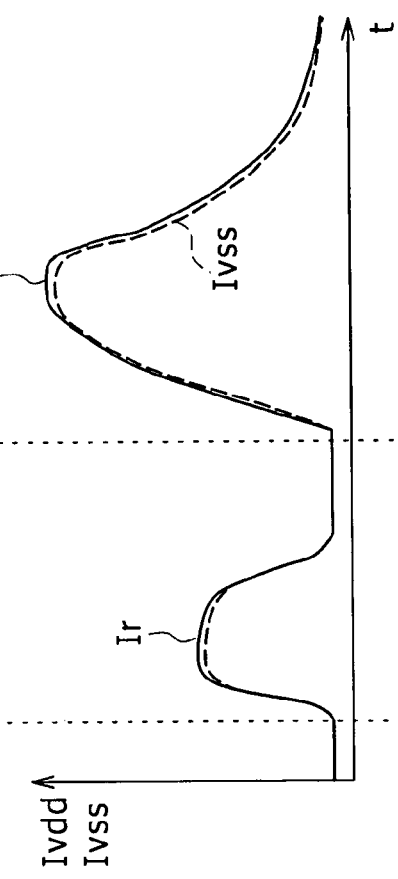
FIG. 2A RST
FIG. 2B STE
FIG. 2C
FIG. 2D

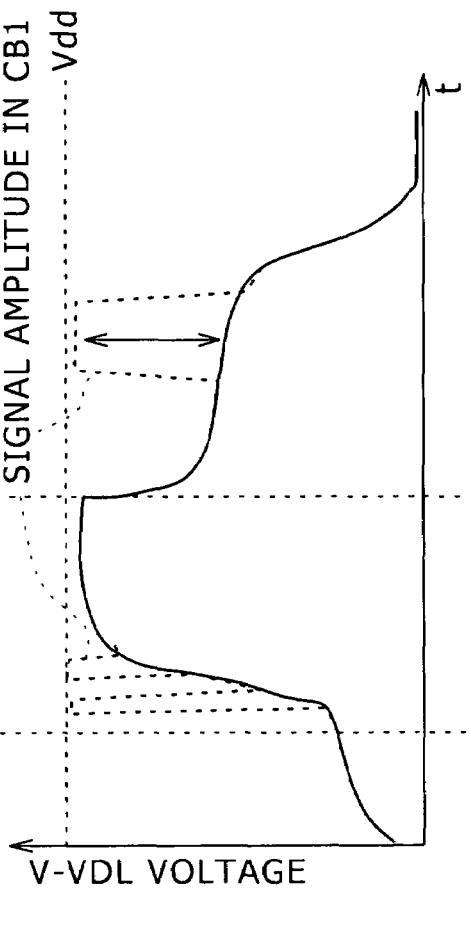

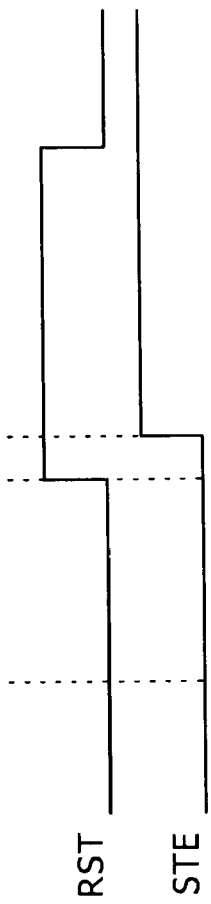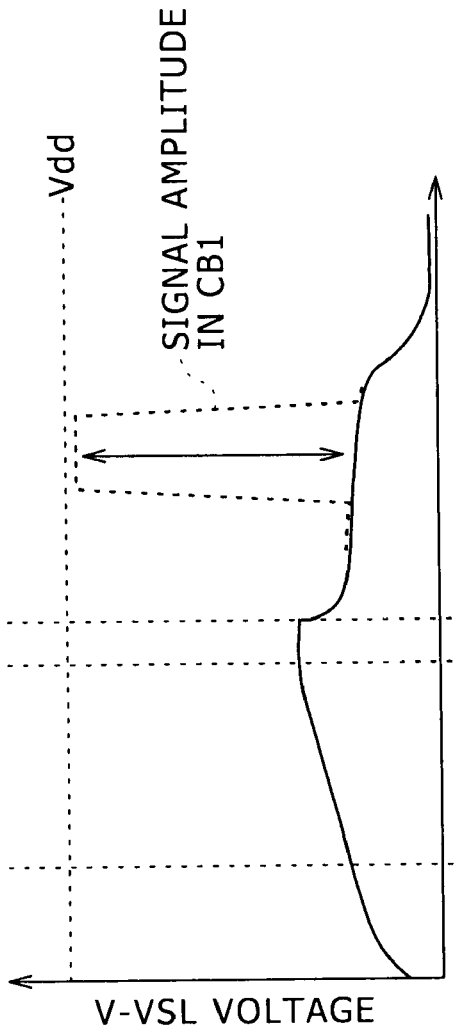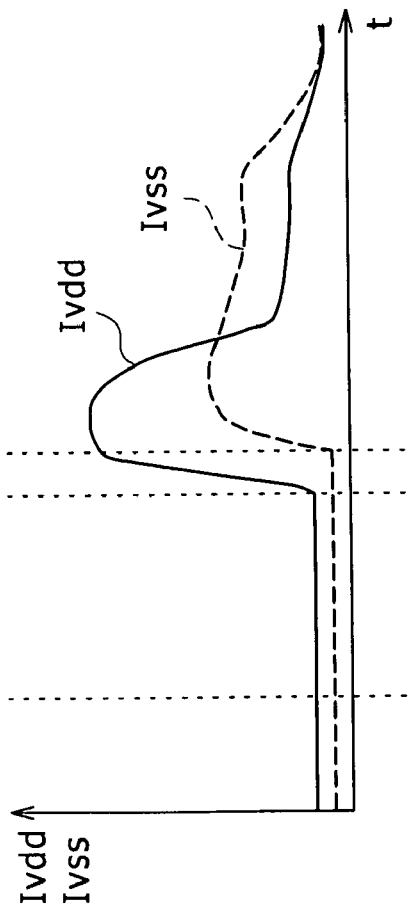

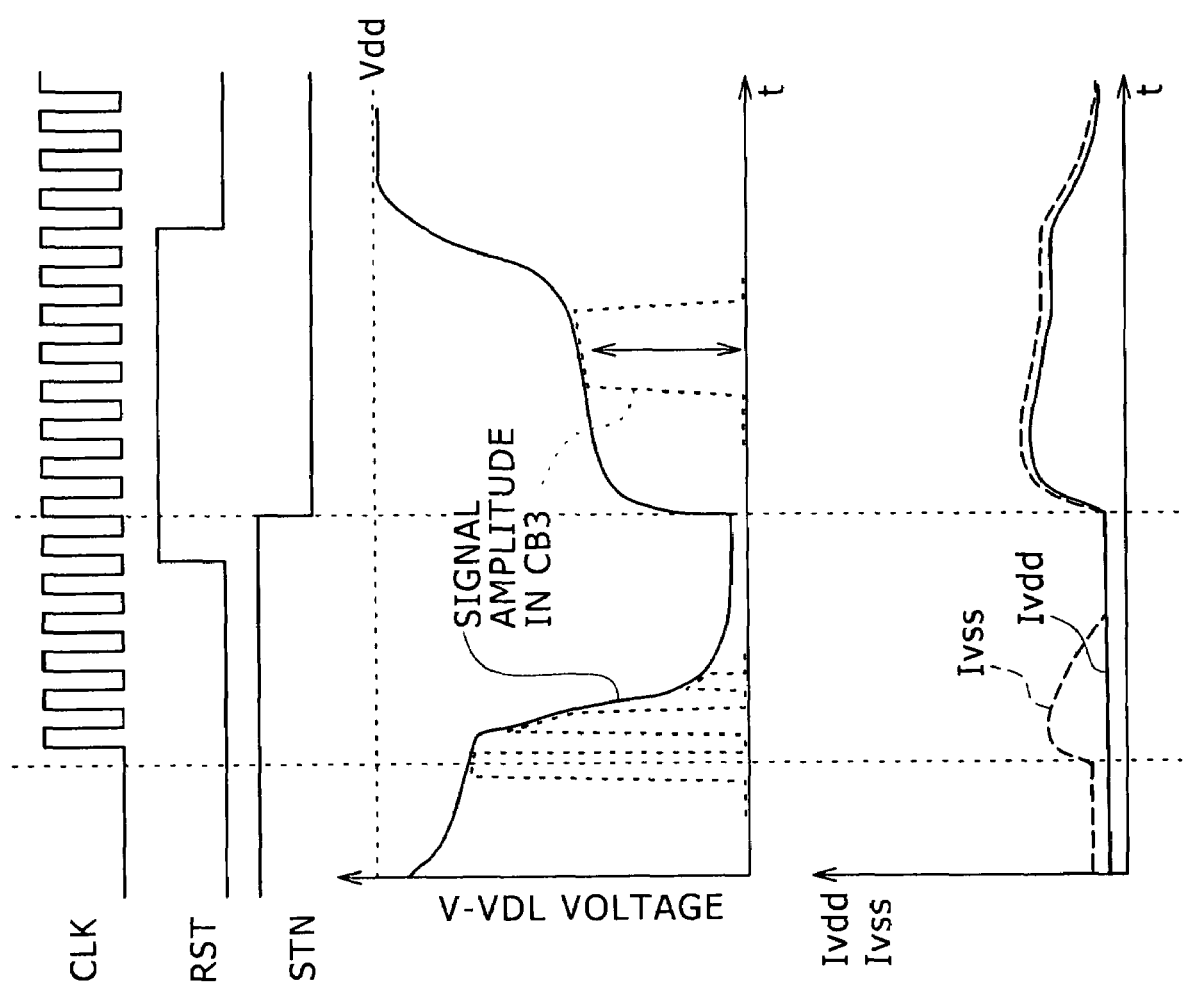

SEMICONDUCTOR INTEGRATED CIRCUIT AND ACTIVATION METHOD OF THE SAME

CROSS REFERENCES TO RELATED APPLICATIONS

The present invention contains subject matter related to Japanese Patent Application JP 2007-192252 filed in the Japan Patent Office on Jul. 24, 2007, the entire contents of which being incorporated herein by reference.

BACKGROUND OF THE INVENTION

1. Field of the Invention

The present invention relates to a semiconductor integrated circuit and activation method of the same.

More particularly, the present invention relates to a semiconductor integrated circuit and activation method of the same for providing reduced power consumption by cutting off a transistor leak current.

2. Description of the Related Art

The MTCMOS (Multi-Threshold Complementary Metal Oxide Semiconductor) technology is known to be able to provide reduced power consumption of the CMOS integrated circuit while preventing the reduction in operating speed of the MOS transistor (refer, for example, to Japanese Patent Laid-Open No. Hei 6-29834).

In a logic circuit block configuration using the MTCMOS technology, a virtual reference voltage line is provided. The virtual reference voltage line is connected to a reference voltage line via a switching transistor. A logic circuit block is connected between the virtual reference voltage line and a source voltage line.

A high-level voltage (e.g., source voltage) is applied to the source voltage line from an external system power supply of the CMOS integrated circuit or other power supply via a power pad. On the other hand, a low-level voltage (e.g., ground potential) is applied to the reference voltage line from an external system power supply of the CMOS integrated circuit or other power supply via a power pad.

In the logic circuit block using the MTCMOS technology, the switching transistor is on when the circuit block is active and off when the circuit block is inactive.

The n-type MOS transistor used as a switching transistor has a higher threshold voltage than the MOS transistor in the logic circuit block.

Therefore, when the logic circuit block is inactive, the leak current of the MOS transistor in the same circuit block is cut off by the switching transistor. On the other hand, when the logic circuit block is active, the MOS transistor in the same circuit block operates at high speed.

A logic circuit block configured as described above will be hereinafter referred to as a "footer-type MTCMOS logic circuit block."

There is also a header-type MTCMOS logic circuit block which stands in contrast to a footer-type MTCMOS logic circuit block. In a header-type MTCMOS logic circuit block, a virtual source voltage line is provided. The virtual source voltage line is connected to a source voltage line via a switching transistor. A logic circuit block is connected between the virtual source voltage line and a reference voltage line.

The p-type MOS transistor used as a switching transistor has a higher threshold voltage than the MOS transistor in the logic circuit block.

In another logic circuit block configuration using the MTCMOS technology, a virtual source voltage line and virtual reference voltage line are provided. The virtual reference voltage line is connected to a reference voltage line via a switching transistor. The virtual source voltage line is connected to a source voltage line via another switching transistor. A logic circuit block is connected between the virtual source voltage line and virtual reference voltage line.

The p-type and n-type MOS transistors used as switching transistors have a higher threshold voltage than the MOS transistor in the logic circuit block.

There are cases in which two logic circuit blocks using the MTCMOS technology, one inactive and another active, coexist at the same time in a CMOS integrated circuit using the MTCMOS technology. Further, some logic circuit blocks not using the MTCMOS technology are connected directly to the source voltage line and reference voltage line and remain active at all times.

If the switching transistor which has been cutting off the leak current is turned on to operate (activate) the inactive logic circuit block, a sporadic current (hereinafter referred to as a "rush current") will flow temporarily in a transient state (at activation) from an inactive to active state. It is known that this leads to a voltage change between the source voltage line and reference voltage line and eventually results in reduced operating speed and malfunction of other active logic circuit blocks.

To prevent malfunction of other logic circuit blocks, the switching transistor size and gate voltage are adjusted so that the peak of the rush current is suppressed.

SUMMARY OF THE INVENTION

There are cases where a logic circuit block using the MTCMOS technology frequently repeats state transitions from an active to inactive state (deactivation) and from an inactive to active state (activation).

On the other hand, the flip-flop circuit of a logic circuit block using the MTCMOS technology cannot hold the value latched immediately before the deactivation when the circuit block is inactive. As a result, the output of the flip-flop circuit may be at high level (1) or low level (0) at the initial moment of activation.

Here, as with a logic circuit block not using the MTCMOS technology, a logic circuit block using the MTCMOS technology includes a flip-flop circuit which causes the circuit block to malfunction unless its value is known at the initial moment of activation. For example, a state transition circuit is a sequential circuit. Therefore, unless the value of the flip-flop circuit making up the state transition circuit is initialized, the logic circuit will malfunction.

It should be noted, however, that the flip-flop circuit included in a data path configured as a pipeline will not cause the logic circuit block to malfunction even if its output value is unknown. No inconvenience will arise as long as the output value is discarded while this value is unknown. As a result, the value of the flip-flop circuit need not necessarily be initialized at the initial moment of activation.

As described above, the output values of the flip-flop circuits included at least in the state transition circuit and other circuitry need to be initialized at the initial moment of activation to prevent malfunction of the logic circuit blocks. Hereinafter, the setting of a proper value in the flip-flop circuits which must be reset for reactivation at the initial moment of activation of the logic circuit block will be referred to as the "initial setup of the logic circuit block." The initial setup is accomplished by setting the flip-flop circuits to "0" or "1." A flip-flop circuit having a reset terminal can be set to "0", for example, by enabling a reset signal fed to the reset terminal.

The initial setup of the logic circuit block changes the values of more flip-flop circuits than when the logic circuit block is normally active. Therefore, a large current will flow during the initial setup, with more power consumed than when the logic circuit block is active. As a result, a frequent repetition of activation and deactivation will result in frequent initial setups, thus leading to large power consumption.

In an MTCMOS logic circuit block, on the other hand, the peak of the rush current is typically suppressed by adjusting the switching transistor size and gate voltage. However, a footer-type MTCMOS logic circuit block has no switching transistor between itself and the source voltage line. As a result, the circuit block may not be able to suppress the rush current flowing from the source voltage line. Similarly, a header-type MTCMOS logic circuit block may not be able to suppress the rush current flowing out into the reference voltage line. This leads to a voltage change between the source voltage line and reference voltage line, possibly resulting in malfunction of other active logic circuit blocks.

From the above, there is demand to provide a semiconductor integrated circuit and activation method of the same which can provide reduced power consumption required for the initial setup at the time of activation of a logic circuit block using the MTCMOS technology so as to suppress the rush current.

According to an embodiment of the present invention, there is provided a semiconductor integrated circuit including:

a circuit section whose activation and deactivation are controlled;

a first voltage line to which one of a source voltage and reference voltage is applied;

a second voltage line adapted to hold, dependently upon an added capacitance, a voltage which supplies power to the circuit section by a voltage difference as compared with the voltage applied to the first voltage line;

a third voltage line to which the other of the source voltage and reference voltage is applied;

a switch section connected between the second and third voltage lines; and a control section adapted to vary the voltage held by the second voltage line so that this voltage approaches the voltage applied to the first voltage line in the process of controlling the inactive circuit section to be activated, the control section further adapted to control the switch section to bring the second and third voltage lines from a disconnected to connected state, the control section still further adapted to initiate an initial setup of the circuit section during a period from when the held voltage begins to change to when the switch section is controlled.

According to an embodiment of the present invention, the control section varies the voltage held by the second voltage line first so that this voltage approaches the voltage applied to the first voltage line in the process of controlling the inactive circuit section to be activated. Next, the control section controls the switch section to bring the second and third voltage lines from a disconnected to connected state. As a result, the voltage held by the second voltage line which is approaching the voltage applied to the first voltage line (e.g., source voltage) begins to change to the voltage applied to the third voltage line (e.g., reference voltage).

Then, the control section initiates the initial setup of the circuit section during a period from when the held voltage begins to change to when the switch section is controlled. Here, the period until the switch section is controlled includes a case in which the switch section is controlled simultaneously with the initial setup. That is, this period includes a case in which the switch section is controlled and the initial setup is initiated at the same time.

The initial setup is performed when the voltage held by the second voltage line is at the midpoint between the voltages applied to the first and second voltage lines. Therefore, the voltage applied to the gate circuit in the circuit section during the initial setup has a small amplitude. This provides reduced power consumption required for the initial setup.

Further, the circuit section is activated while performing the initial setup, with the voltage of the second voltage line brought sufficiently close to the voltage of the first voltage line. Therefore, the rush current will flow on the side of the first voltage line in the same amounts as the rush current flowing on the side of the third voltage line. This makes it possible to reflect the suppression effect of the rush current on the side of the first voltage line which has no switch section.

Preferably, in the semiconductor integrated circuit of an embodiment of the present invention, the circuit section includes a flip-flop circuit. Further preferably, the control circuit supplies a clock signal to the flip-flop circuit. Still further preferably, the control circuit controls the clock signal so that the voltage held by the second voltage line approaches the voltage applied to the first voltage line.

Preferably, in the semiconductor integrated circuit of an embodiment of the present invention, the circuit section includes a predetermined conductive field effect transistor having a first threshold voltage. Further preferably, the switch section includes a predetermined conductive field effect transistor having a second threshold voltage higher than the first threshold voltage.

According to another embodiment of the present invention, there is provided an activation method of a semiconductor integrated circuit, the semiconductor integrated circuit including a circuit section whose activation and deactivation are controlled;

a first voltage line to which one of a source voltage and reference voltage is applied;

a second voltage line adapted to hold, dependently upon an added capacitance, a voltage which supplies power to the circuit section by a voltage difference as compared with the voltage applied to the first voltage line;

a third voltage line to which the other of the source voltage and reference voltage is applied; and a switch section connected between the second and third voltage lines, the activation method including the steps of:

varying the voltage held by the second voltage line so that this voltage approaches the voltage applied to the first voltage line in the process of controlling the inactive circuit section to be activated;

controlling the switch section to bring the second and third voltage lines from a disconnected to connected state; and initiating the initial setup of the circuit section during a period from when the held voltage begins to change to when the switch section is controlled.

As described above, the present invention provides reduced power consumption required for the initial setup during activation of a logic circuit block using the MTCMOS technology, thus suppressing the rush current.

BRIEF DESCRIPTION OF THE DRAWINGS

FIGS. 2A to 2D are diagrams illustrating an example of activating the footer-type MTCMOS logic circuit block;

FIGS. 3A to 3E are diagrams illustrating an example of activating the footer-type MTCMOS logic circuit block according to the first embodiment of the present invention;

FIGS. 4A to 4D are diagrams illustrating an example of activating the footer-type MTCMOS logic circuit block when a virtual reference voltage line is not forcefully charged;

FIGS. 6A to 6E are diagrams illustrating an example of activating the header-type MTCMOS logic circuit block according to the second embodiment of the present invention.

DETAILED DESCRIPTION OF THE PREFERRED EMBODIMENTS

Figure 1:
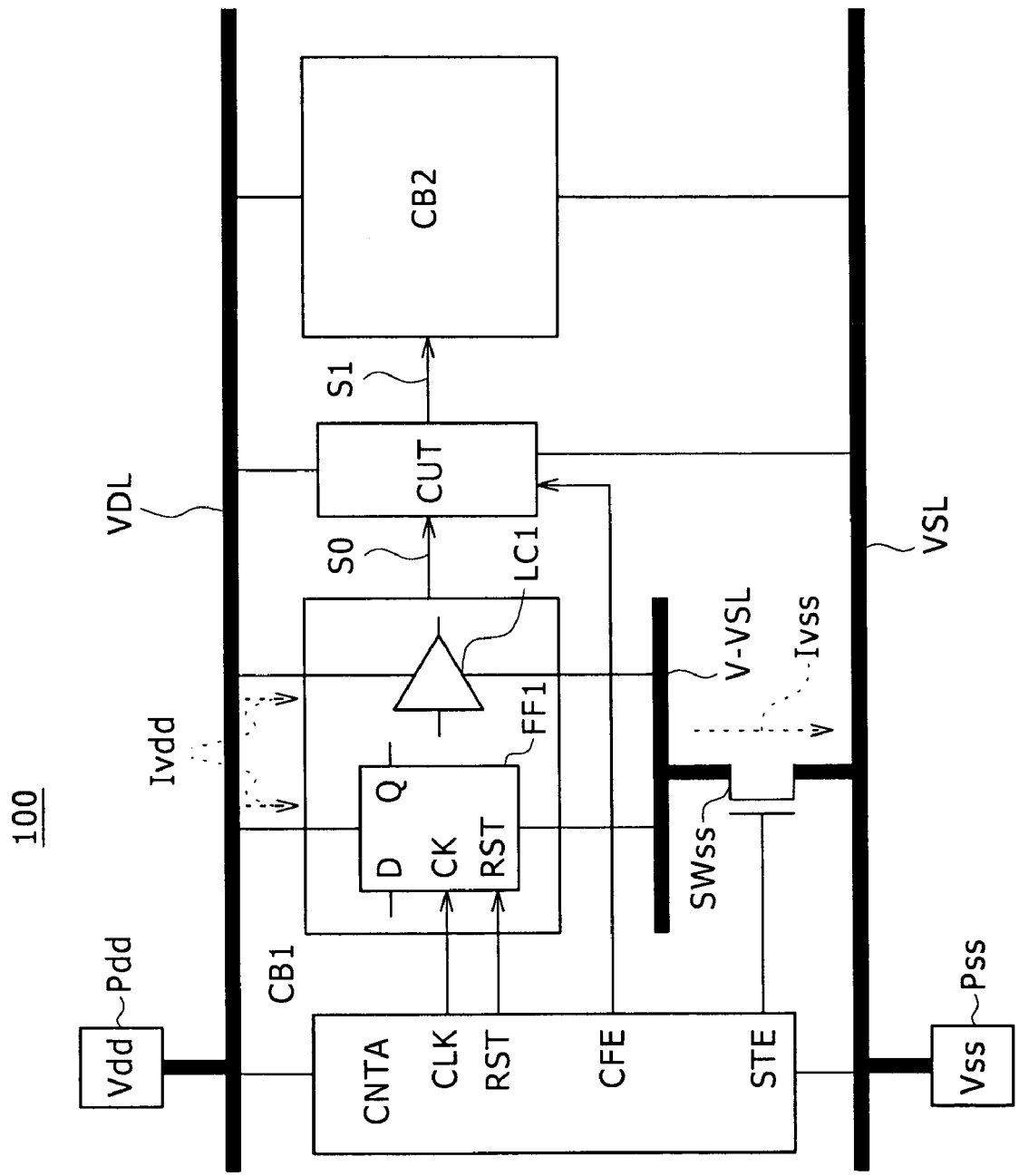
FIG. 1 is a diagram illustrating an example of a footer-type MTCMOS logic circuit block according to a first embodiment of the present invention.

FIG. 1 is a diagram illustrating an example of a footer-type MTCMOS logic circuit block according to a first embodiment of the present invention.

A CMOS integrated circuit 100 includes a control circuit block CNTA, logic circuit block CB1, unknown value propagation cutoff circuit CUT and logic circuit block CB2. The same circuit 100 further includes a source voltage line VDL, reference voltage line VSL, virtual reference voltage line V-VSL, switching transistor SWss and power pads Pdd and Pss.

The logic circuit block CB1 is a footer-type MTCMOS logic circuit block. In contrast, the logic circuit block CB2 is a circuit block not using the MTCMOS technology.

The logic circuit block CB1 is connected to the source voltage line VDL and virtual reference voltage line V-VSL. The virtual reference voltage line V-VSL is connected to the reference voltage line VSL via the switching transistor SWss.

The logic circuit block CB1 includes a flip-flop circuit FF1 and logic circuit cell LC1.

The flip-flop circuit FF1 is connected to the source voltage line VDL and virtual reference voltage line V-VSL. The same circuit FF1 includes a data input terminal D, data output terminal Q, clock terminal CK and reset terminal RST. The clock terminal CK and reset terminal RST are connected respectively to a clock signal CLK and reset signal RST of the control circuit block CNTA which will be described later.

It should be noted that the flip-flop circuit FF1 is merely an example, and other configuration is also acceptable. For example, if the logic circuit block CB1 never malfunctions even when the value of flip-flop circuit FF1 is unknown at the time of the initial setup of the same block CB1, the flip-flop circuit value need not necessarily be initialized at the initial activation. The above case in which the logic circuit block CB1 never malfunctions includes when the flip-flop circuit is included in a data path configured as a pipeline. In this case, the flip-flop circuit need not have the reset terminal RST.

The logic circuit cell LC1 is connected to the source voltage line VDL and virtual reference voltage line V-VSL.

In FIG. 1, the logic circuit block CB1 is shown to include the single flip-flop circuit FF1 and single logic circuit cell LC1. However, the same circuit CB1 may include the plurality of flip-flop circuits FF1 and the plurality of logic circuit cells LC1.

Although not intentionally, capacitances are added to the virtual reference voltage line V-VSL typically between the line and semiconductor substrate, at the connection point with the MOS transistor included in the logic circuit block CB1, and at the connection point with the switching transistor SWss and so on.

On the other hand, the control circuit block CNTA, unknown value propagation cutoff circuit CUT and logic circuit block CB2 are connected to the source voltage line VDL and reference voltage line VSL.

The source voltage line VDL and reference voltage line VSL are connected respectively to the power pads Pdd and Pss. The power pads Pdd and Pss are powered from the system power supply provided on the mounting substrate during mounting or other power supply. At this time, a high-level source voltage Vdd is applied to the power pad Pdd, and a low-level reference voltage (e.g., ground potential) Vss to the power pad Pss.

The control circuit block CNTA supplies the clock signal CLK and reset signal RST to the logic circuit block CB1. The clock signal CLK and reset signal RST are supplied to the flip-flop circuit FF1 included in the logic circuit block CB1.

The control circuit block CNTA applies a switching transistor enable signal STE to the gate of the switching transistor SWss. When the switching transistor enable signal STE is at high level, the switching transistor SWss is on. As a result, the virtual reference voltage line V-VSL and reference voltage line VSL are connected together. When the two lines are connected, the virtual reference voltage line V-VSL is at the same voltage as the reference voltage Vss.

In contrast, when the switching transistor enable signal STE is at low level, the switching transistor SWss is off. As a result, the virtual reference voltage line V-VSL and reference voltage line VSL are disconnected from each other.

The switching transistor SWss is an n-type MOS transistor. The same transistor SWss has a higher threshold voltage than the MOS transistor included in the logic circuit block CB1 to cut off the leak current when the logic circuit block CB1 is inactive.

Further, the control circuit block CNTA supplies an unknown value propagation cutoff signal CFE to the unknown value propagation cutoff circuit CUT.

When the logic circuit block CB1 is inactive or until the initial setup is complete during activation, the unknown value propagation cutoff signal CFE is enabled. This fixes a signal S0 from the logic circuit block CB1, for example, to low level (0) and feeds the signal S0 to the logic circuit block CB2 as a signal S1.

At the completion of the initial setup of the logic circuit block CB1, the unknown value propagation cutoff signal CFE is disabled. This feeds the signal S0 from the logic circuit block CB1 to the logic circuit block CB2 in an as-is form as the signal S1.

A current Ivdd flows from the source voltage line VDL into the logic circuit block CB1. In contrast, a current Ivss flows out from the logic circuit block CB1 into the reference voltage line VSL through the virtual reference voltage line V-VSL and switching transistor SWss.

The control circuit block CNTA, unknown value propagation cutoff circuit CUT and logic circuit block CB2 must remain turned on (powered) at all times at least while the system is active. Therefore, these circuit blocks do not have the virtual reference voltage line V-VSL. Instead, these blocks are connected directly to the reference voltage line VSL, bypassing the switching transistor SWss.

In FIG. 1, the CMOS integrated circuit 100 is shown to include the single control circuit block CNTA, single logic circuit block CB1, single unknown value propagation cutoff circuit CUT and single logic circuit block CB2. However, the same circuit 100 may include the plurality of each of these circuit blocks. Further, the single control circuit block CNTA may control the plurality of logic circuit blocks CB1 and the plurality of unknown value propagation cutoff circuits CUT.

FIGS. 2A to 2D are diagrams illustrating an example of activating the footer-type MTCMOS logic circuit block.

When the logic circuit block CB1 is inactive, the switching transistor SWss is off. As a result, the virtual reference voltage line V-VSL and reference voltage line VSL are disconnected from each other. The capacitances added to the internal components of the logic circuit block CB1 and to the virtual reference voltage line V-VSL are charged by the leak current over time. If the logic circuit block CB1 is inactive for a sufficiently long period of time, the voltages of the internal components of the logic circuit block CB1 and the virtual reference voltage line V-VSL will drop to almost the same level as the source voltage Vdd as illustrated in FIG. 2C.

When activating the logic circuit block CB1, the control circuit block CNTA enables (pulls up to high level) the switching transistor enable signal STE first and then turns on the switching transistor SWss as illustrated in FIG. 2B. At this time, a rush current Ir flows from the virtual reference voltage line V-VSL into the reference voltage line VSL. The peak of the rush current Ir is suppressed, for example, by adjusting the voltage level of the switching transistor enable signal STE.

Thereafter, if the power and noise at the time of the initial setup are not taken into consideration, the voltage of the virtual reference voltage line V-VSL will drop to the reference voltage Vss as a result of the sufficient discharging of the stored charge as illustrated in FIG. 2C. Then, the control circuit block CNTA will enable (pull to high level) the reset signal RST as illustrated in FIG. 2A to initiate the initial setup of the logic circuit block CB1.

The initial setup resets the values of the flip-flop circuits included in the state transition circuit and other circuitry to prevent malfunction of the logic circuit blocks. The initial setup causes the values of more flip-flop circuits to change to "0" (low level) or "1" (high level) than when the logic circuit block is normally active. As a result, the current Ivdd and current Ivss flowing during the initial setup are large as illustrated in FIG. 2D. On the other hand, the amplitude of the glitch in the voltage of the MOS transistor included in the logic circuit block CB1 is almost equal to the source voltage Vdd as illustrated in FIG. 2C. Currents flowing during the initial setup lead to large power consumption. Further, currents flowing during the initial setup lead to noise in the peripheral circuitry, possibly resulting in malfunction of other active logic circuit blocks.

FIGS. 3A to 3E are diagrams illustrating an example of activating the footer-type MTCMOS logic circuit block according to the first embodiment of the present invention.

First, the control circuit block CNTA supplies part of the input signal to the inactive logic circuit block CB1 to activate some components in the same block CB1. This accelerates the charging of the capacitances added to the internal components of the logic circuit block CB1 and to the virtual reference voltage line V-VSL, forcefully raising the voltage level of the virtual reference voltage line V-VSL to a level where the logic circuit block CB1 becomes inactive (level close to the source voltage Vdd).

As illustrated in FIG. 3A, one among the examples of the input signal supplied to the logic circuit block CB1 is the clock signal CLK. When the logic circuit block CB1 is inactive, the control circuit block CNTA does not supply the clock signal CLK. When the clock signal CLK is supplied to the logic circuit block CB1, the clock circuit and the clock input section of the flip-flop circuit are activated. Therefore, the current Ivdd flows as illustrated in FIG. 3E. By loading a clock gating signal into the control circuit block CNTA and controlling this signal, the clock signal CLK can be stopped or started in a controlled manner.

The switching transistor SWss is off. Therefore, the current Ivss does not flow. As a result, the capacitances added to the internal components of the logic circuit block CB1 and to the virtual reference voltage line V-VSL are charged by the current Ivdd, sufficiently raising the voltage level of the virtual reference voltage line V-VSL. This permits sufficient charging of the capacitances added to the internal components of the logic circuit block CB1 and to the virtual reference voltage line V-VSL without fail, irrespective of the length of time during which the logic circuit block CB1 is inactive.

Next, the control circuit block CNTA enables the reset signal RST as illustrated in FIG. 3B. Then, the same block CNTA enables the switching transistor enable signal STE as illustrated in FIG. 3C. That is, the initial setup and activation of the logic circuit block CB1 are performed simultaneously.

At this time, the peak of the current Ivss is suppressed, for example, by adjusting the voltage level of the switching transistor enable signal STE.

Power consumption is proportional to the square of voltage. In this case, the voltage refers to the voltage which is actually applied to the gate circuit formed by the MOS transistor. That is, the voltage refers, in the case of the logic circuit block CB1, to the difference between the source voltage Vdd of the source voltage line VDL and the voltage of the virtual reference voltage line V-VSL. The present embodiment performs the initial setup when the voltage difference reaches the minimum voltage level which permits the gate circuit to become active. At this time, the voltage level of the virtual reference voltage line V-VSL has yet to drop sufficiently and remains still high. Therefore, the voltage actually applied to the gate circuit during the initial setup is roughly the minimum voltage which permits the gate circuit to become active. As a result, the initial setup is performed at the voltage level sufficiently smaller than the source voltage Vdd. As a consequence, the signal amplitude is small in the internal components of the logic circuit block CB1. This provides significantly reduced power consumption during the initial setup.

It should be noted that the input signal other than the clock signal CLK may be supplied to accelerate the charging of the capacitances added to the internal components of the logic circuit block CB1 and to the virtual reference voltage line V-VSL. For example, the input signal may be supplied to the gates of some of the CMOS transistors making up the combinational circuit in the logic circuit block CB1.

On the other hand, it is not always necessary to charge the capacitances added to the internal components of the logic circuit block CB1 and to the virtual reference voltage line V-VSL by supplying the clock signal CLK or other input signal to the logic circuit block CB1. For example, the source voltage line VDL and virtual reference voltage line V-VSL may be connected with a p-type MOS transistor having a high threshold voltage. In this case, this p-type MOS transistor is turned on to connect the source voltage line VDL and virtual reference voltage line V-VSL together. This accelerates the charging of the capacitances added to the internal components of the logic circuit block CB1 and to the virtual reference voltage line V-VSL. At this time, the peak of the current used to charge the capacitances can be suppressed by adjusting the size and gate voltage of the p-type MOS transistor, thus preventing the malfunction of other active logic circuit blocks.

Further, the reset signal RST and switching transistor enable signal STE may be enabled at the same time. Still further, if the initial setup can be performed when the voltage level of the virtual reference voltage line V-VSL has yet to drop sufficiently and is still high, the switching transistor enable signal STE may be enabled first followed by the reset signal RST.

FIGS. 4A to 4D are diagrams illustrating an example of activating the footer-type MTCMOS logic circuit block when the virtual reference voltage line is not forcefully charged.

When the footer-type MTCMOS logic circuit block CB1 is inactive, the current Ivdd flows in extremely small amounts due to a leak current as illustrated in FIG. 4D. As a result, the capacitances added to the internal components of the logic circuit block CB1 and to the virtual reference voltage line V-VSL are charged little by little as illustrated in FIG. 4C.

If the logic circuit block CB1 is inactive for a short period of time, the initial setup will be performed with the voltage of the virtual reference voltage line V-VSL still being low as illustrated in FIG. 4C unless the capacitances added to the internal components of the logic circuit block CB1 and to the virtual reference voltage line V-VSL are forcefully charged.

When the initial setup and activation of the logic circuit block CB1 are performed simultaneously by enabling the reset signal RST and switching transistor enable signal STE as illustrated in FIGS. 4A and 4B, the current Ivss flowing from the side of the reference voltage Vss is suppressed by adjusting the size and gate voltage of the switching transistor SWss as illustrated in FIG. 4D.

However, there is no switching transistor on the side of the source voltage Vdd. As a result, the current Ivdd flowing from the source voltage line VDL cannot be suppressed, causing the large current Ivdd to flow as illustrated in FIG. 4D.

On the other hand, if the logic circuit block CB1 is activated while at the same time performing the initial setup thereof with the capacitances added to the internal components of the logic circuit block CB1 and to the virtual reference voltage line V-VSL sufficiently charged close to the source voltage Vdd as illustrated in FIG. 3E, the current Ivdd will flow in from the side of the source voltage Vdd in the same amounts as the current Ivss flowing out from the side of the reference voltage Vss. This suppresses the currents Ivdd and Ivss roughly to the same extent during the initial setup. That is, the suppression effect produced by the switching transistor SWss can also be reflected on the side of the source voltage Vdd having no switching transistor.

This provides reduced power noise on both sides of the source voltage Vdd and reference voltage Vss at the time of activation during the initial setup. This eliminates the need for any noise prevention measures such as deactivating other active logic circuit blocks when activating the logic circuit block CB1.

In the activation of the logic circuit block CB1 simultaneously with the initial setup thereof as illustrated in FIGS. 4A to 4D, if the capacitances added to the internal components of the logic circuit block CB1 and to the virtual reference voltage line V-VSL are not sufficiently charged close to the source voltage Vdd, the large current Ivdd will flow in from the side of the source voltage Vdd. This causes the noise to become no longer negligible. It is important, therefore, to sufficiently charge the capacitances added to the internal components of the logic circuit block CB1 and to the virtual reference voltage line V-VSL before activating the logic circuit block CB1.

It should be noted that the logic circuit block CB1 is an example of the circuit section of the embodiment of the present invention. The source voltage line VDL is an example of the first voltage line of the embodiment of the present invention. The virtual reference voltage line V-VSL is an example of the second voltage line of the embodiment of the present invention. The reference voltage line VSL is an example of the third voltage line of the embodiment of the present invention. The switching transistor SWss is an example of the switch section and predetermined conductive field effect transistor having the second threshold voltage of the embodiment of the present invention. The control circuit block CNTA is an example of the control section of the embodiment of the present invention. The clock signal CLK is an example of the clock signal of the embodiment of the present invention. The n-type MOS transistor included in the logic circuit block CB1 is an example of the predetermined conductive field effect transistor having the first threshold voltage of the embodiment of the present invention.

Figure 5:
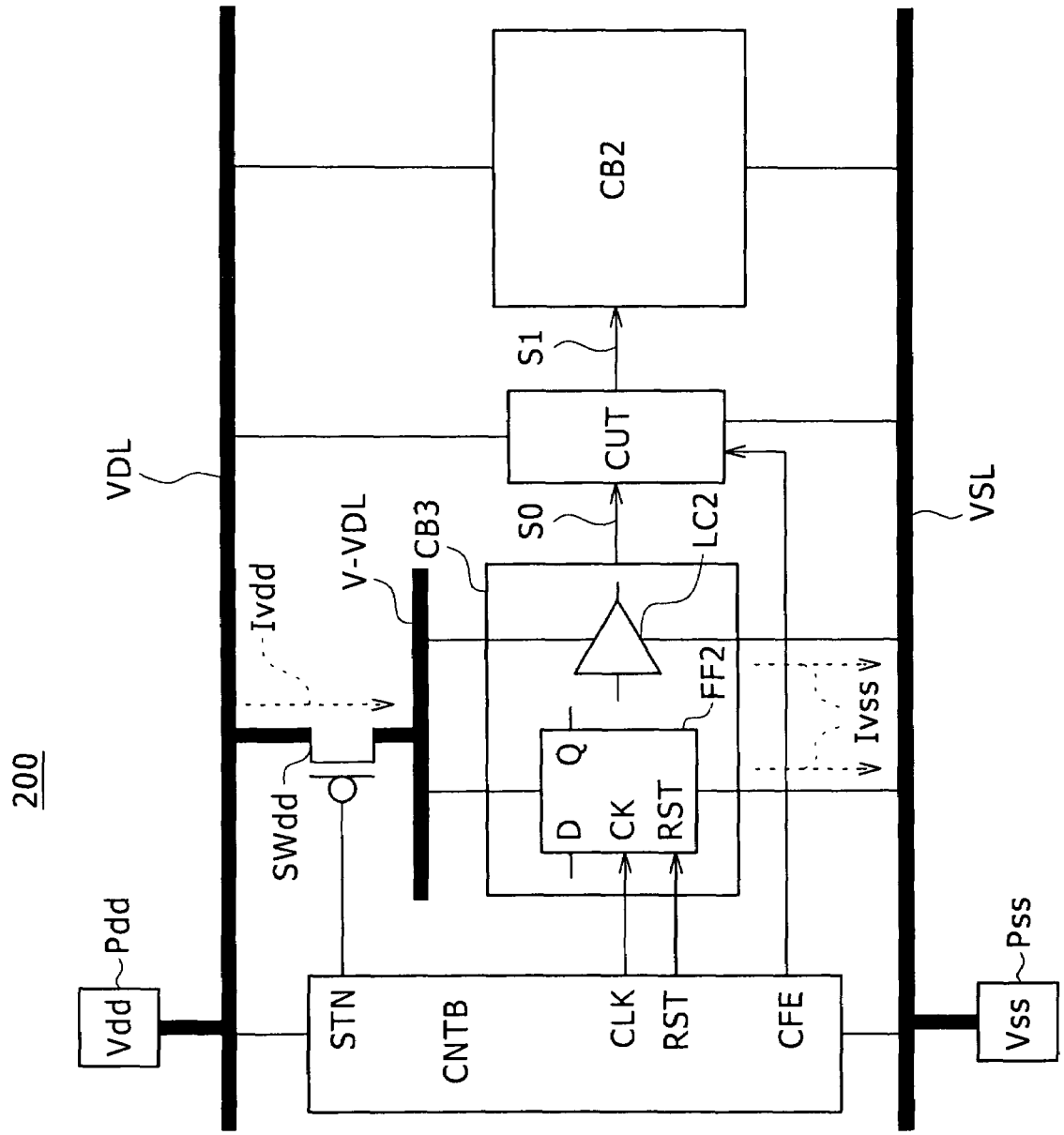
FIG. 5 is a diagram illustrating an example of a header-type MTCMOS logic circuit block according to a second embodiment of the present invention.

FIG. 5 is a diagram illustrating an example of a header-type MTCMOS logic circuit block according to a second embodiment of the present invention.

A CMOS integrated circuit 200 includes a control circuit block CNTB, logic circuit block CB3 and unknown value propagation cutoff circuit CUT. The same circuit 200 further includes the logic circuit block CB2, source voltage line VDL and reference voltage line VSL. The same circuit 200 still further includes a virtual source voltage line V-VDL, switching transistor SWdd and the power pads Pdd and Pss. In FIG. 5, the same reference numerals as shown in FIG. 1 represent the same components.

The logic circuit block CB1 in FIG. 1 is a footer-type MTCMOS logic circuit block. The logic circuit block CB3 in FIG. 5 differs from the logic circuit block CB1 in that the same block CB3 is a header-type MTCMOS logic circuit block. Further, because the logic circuit block CB3 is a header-type MTCMOS logic circuit block, a switching transistor enable signal STN of the control circuit block CNTB is a negative logic signal.

The logic circuit block CB3 is connected to the virtual source voltage line V-VDL and reference voltage line VSL. The virtual source voltage line V-VDL is connected to the source voltage line VDL via the switching transistor SWdd.

The logic circuit block CB3 includes a flip-flop circuit FF2 and logic circuit cell LC2.

The flip-flop circuit FF2 is connected to the virtual source voltage line V-VDL and reference voltage line VSL. The same circuit FF2 includes the data input terminal D, data output terminal Q, clock terminal CK and reset terminal RST. The clock terminal CK and reset terminal RST are connected to the clock signal CLK and reset signal RST of the control circuit block CNTB which will be described later.

It should be noted that the flip-flop circuit FF2 is merely an example, and other configuration is also acceptable. For example, if the logic circuit block CB3 never malfunctions even when the value of flip-flop circuit is unknown at the time of the initial setup of the same block CB3, the flip-flop circuit value need not necessarily be initialized at the initial activation. The above case in which the logic circuit block CB3 never malfunctions includes when the flip-flop circuit is included in a data path configured as a pipeline. In this case, the flip-flop circuit need not have the reset terminal RST.

The logic circuit cell LC2 is connected to the virtual source voltage line V-VDL and reference voltage line VSL.

In FIG. 5, the logic circuit block CB3 is shown to include the single flip-flop circuit FF2 and single logic circuit cell LC2. However, the same circuit CB3 may include the plurality of flip-flop circuits FF2 and the plurality of logic circuit cells LC2.

Although not intentionally, capacitances are added to the virtual source voltage line V-VDL typically between the line and semiconductor substrate, at the connection point with the MOS transistor included in the logic circuit block CB3, at the connection point with the switching transistor SWss and so on.

The control circuit block CNTB is connected to the source voltage line VDL and reference voltage line VSL.

The same block CNTB supplies the clock signal CLK and reset signal RST to the logic circuit block CB3 as does the control circuit block CNTA. The clock signal CLK and reset signal RST are supplied to the flip-flop circuit FF2 included in the logic circuit block CB3.

Further, the control circuit block CNTB applies the switching transistor enable signal STN to the gate of the switching transistor SWdd. However, unlike the switching transistor enable signal STE of the control circuit block CNTA, the switching transistor SWdd is on when the switching transistor enable signal STN is at low level. As a result, the source voltage line VDL and virtual source voltage line V-VDL are connected together. When the two lines are connected, the virtual source voltage line V-VDL is roughly at the same voltage as the source voltage Vdd.

In contrast, when the switching transistor enable signal STN is at high level, the switching transistor SWdd is off. As a result, the source voltage line VDL and virtual source voltage line V-VDL are disconnected from each other.

The switching transistor SWdd is a p-type MOS transistor. The same transistor SWdd has a higher threshold voltage than the MOS transistor included in the logic circuit block CB3 to cut off the leak current when the logic circuit block CB3 is inactive.

The unknown value propagation cutoff signal CFE and logic circuit block CB2 function in the same manner as in the first embodiment.

In FIG. 5, the CMOS integrated circuit 200 is shown to include the single control circuit block CNTB, single logic circuit block CB3, single unknown value propagation cutoff circuit CUT and single logic circuit block CB2. However, the same circuit 200 may include the plurality of each of these circuit blocks. Further, the single control circuit block CNTB may control the plurality of logic circuit blocks CB3 and the plurality of unknown value propagation cutoff circuits CUT.

FIGS. 6A to 6E are diagrams illustrating an example of activating the header-type MTCMOS logic circuit block according to the second embodiment of the present invention.

First, the control circuit block CNTB supplies part of the input signal to the inactive logic circuit block CB3 to activate some components in the same block CB3. This accelerates the discharging of the charge stored in the capacitances added the internal components of the logic circuit block CB3 and to the virtual source voltage line V-VDL, forcefully bringing the voltage level of the virtual source voltage line V-VDL down to a level where the logic circuit block CB3 becomes inactive (level close to the reference voltage Vss).

One among the examples of the input signal supplied to the logic circuit block CB3 is the clock signal CLK. When the logic circuit block CB3 is inactive, the control circuit block CNTB does not supply the clock signal CLK. When the clock signal CLK is supplied to the logic circuit block CB3 as illustrated in FIG. 6A, the clock input section of the flip-flop circuit is activated. Therefore, the current Ivs flows as illustrated in FIG. 6E. By loading a clock gating signal into the control circuit block CNTB and controlling this signal, the clock signal CLK can be stopped or started in a controlled manner.

The switching transistor SWdd is off. Therefore, the current Ivdd does not flow as illustrated in FIG. 6E. As a result, the charge stored in the capacitances added to the internal components of the logic circuit block CB3 and to the virtual source voltage line V-VDL by the current Ivss is discharged, sufficiently bringing down the voltage level of the virtual source voltage line V-VDL as illustrated in FIG. 6D. This permits sufficient discharging of the charge stored in the capacitances added to the internal components of the logic circuit block CB3 and to the virtual source voltage line V-VDL without fail, irrespective of the length of time during which the logic circuit block CB3 is inactive.

Next, the control circuit block CNTB enables (pulls up to high level) the reset signal RST as illustrated in FIG. 6B. Then, the same block CNTB enables (pulls down to low level) the switching transistor enable signal STN as illustrated in FIG. 6C. That is, the initial setup and activation of the logic circuit block CB3 are performed simultaneously.

At this time, the peak of the current Ivdd is suppressed, for example, by adjusting the voltage level of the switching transistor enable signal STN.

The present embodiment performs the initial setup when the voltage level of the virtual source voltage line V-VDL has yet to rise sufficiently and is still low. Therefore, the voltage actually applied to the gate circuit of the logic circuit block CB3 during the initial setup is roughly the minimum voltage which permits the gate circuit to become active. As a result, the initial setup is performed at a voltage level sufficiently smaller than the original source voltage Vdd. As a consequence, the signal amplitude is small in the internal components of the logic circuit block CB3. This provides significantly reduced power consumption during the initial setup.

It should be noted that the input signal other than the clock signal CLK may be used to accelerate the discharging of the charge stored in the capacitances added to the internal components of the logic circuit block CB3 and to the virtual source voltage line V-VDL. For example, the input signal may be supplied to the gates of some of the CMOS transistors making up the combinational circuit in the logic circuit block CB3.

On the other hand, it is not always necessary to discharge the charge stored in the capacitances added to the internal components of the logic circuit block CB3 and to the virtual source voltage line V-VDL by supplying the clock signal CLK or other input signal to the logic circuit block CB3. For example, the virtual source voltage line V-VDL and reference voltage line VSL may be connected with an n-type MOS transistor having a high threshold voltage. In this case, this n-type MOS transistor is turned on to connect the virtual source voltage line V-VDL and reference voltage line VSL together. This accelerates the discharging of the charge stored in the capacitances added to the internal components of the logic circuit block CB3 and to the virtual source voltage line V-VDL. At this time, the peak of the current used for discharging can be suppressed by adjusting the size and gate voltage of the n-type MOS transistor, thus preventing the malfunction of other active logic circuit blocks.

Further, the reset signal RST and switching transistor enable signal STN may be enabled at the same time. Still further, if the initial setup can be performed when the voltage level of the virtual source voltage line V-VDL has yet to rise sufficiently and is still low, the switching transistor enable signal STN may be enabled first followed by the reset signal RST.

If the logic circuit block CB3 is activated while at the same time performing the initial setup thereof when the voltage of the virtual source voltage line V-VDL sufficiently has been sufficiently lowered close to the reference voltage Vss as illustrated in FIG. 6E, the current Ivss will flow out from the side of the reference voltage Vss only in the same amounts as the current Ivdd flowing in from the side of the source voltage Vdd. This suppresses the currents Ivdd and Ivss roughly to the same extent. That is, the suppression effect produced by the switching transistor SWdd can also be reflected on the side of the reference voltage Vss having no switching transistor.

It should be noted that the logic circuit block CB3 is an example of the circuit section of the embodiment of the present invention. The reference voltage line VSL is an example of the first voltage line of the embodiment of the present invention. The virtual source voltage line V-VDL is an example of the second voltage line of the embodiment of the present invention. The source voltage line VDL is an example of the third voltage line of the embodiment of the present invention. The switching transistor SWdd is an example of the switch section and predetermined conductive field effect transistor having the second threshold voltage of the embodiment of the present invention. The control circuit block CNTB is an example of the control section of the embodiment of the present invention. The clock signal CLK is an example of the clock signal of the embodiment of the present invention. The p-type MOS transistor included in the logic circuit block CB3 is an example of the predetermined conductive field effect transistor having the first threshold voltage of the embodiment of the present invention.

As described above, the embodiment of the present invention provides reduced power consumption required for the initial setup during activation of a logic circuit block using the MTCMOS technology.

Further, the embodiment of the present invention provides reduced rush current not only on the side of the logic circuit block having a switching transistor but also on the side thereof not having any such transistor which is directly connected to the source voltage line VDL or reference voltage line VSL. This eliminates the need for any noise prevention measures such as deactivating other active logic circuit blocks when activating a logic circuit block using the MTCMOS technology.

Although the preferred embodiments of the present invention have been described above, various modifications or combinations required because of design convenience or other factors should be construed as falling within the scope of the inventions as defined in the appended claims and also within the scope of the inventions associated with the specific examples described in the DETAILED DESCRIPTION OF THE PREFERRED EMBODIMENTS.

What is claimed is:

1. A semiconductor integrated circuit comprising:
   a circuit section whose activation and deactivation are controlled;
   a first voltage line to which one of a source voltage and reference voltage is applied;
   a second voltage line adapted to hold, dependently upon an added capacitance, a voltage which supplies power to the circuit section by a voltage difference as compared with the voltage applied to the first voltage line;
   a third voltage line to which the other of the source voltage and reference voltage is applied;
   a switch section connected between the second and third voltage lines; and
   a control section adapted to vary the voltage held by the second voltage line so that this voltage approaches the voltage applied to the first voltage line in the process of controlling the inactive circuit section to be activated, the control section further adapted to control the switch section to bring the second and third voltage lines from a disconnected to connected state, the control section still further adapted to initiate an initial setup of the circuit section during a period from when the held voltage begins to change to when the switch section is controlled.

2. The semiconductor integrated circuit of claim 1, wherein the circuit section includes a flip-flop circuit, and wherein the control section supplies a clock signal to the flip-flop circuit and controls the clock signal so that the voltage held by the second voltage line approaches the voltage applied to the first voltage line.

3. The semiconductor integrated circuit of claim 1, wherein the circuit section includes a predetermined conductive field effect transistor having a first threshold voltage, and wherein
the switch section includes a predetermined conductive field effect transistor having a second threshold voltage higher than the first threshold voltage.

4. An activation method of a semiconductor integrated circuit, the semiconductor integrated circuit including
   a circuit section whose activation and deactivation are controlled;
   a first voltage line to which one of a source voltage and reference voltage is applied;
   a second voltage line adapted to hold, dependently upon an added capacitance, a voltage which supplies power to the circuit section by a voltage difference as compared with the voltage applied to the first voltage line;
   a third voltage line to which the other of the source voltage and reference voltage is applied; and
   a switch section connected between the second and third voltage lines,
   the activation method comprising the steps of:
   varying the voltage held by the second voltage line so that this voltage approaches the voltage applied to the first voltage line in the process of controlling the inactive circuit section to be activated;
   controlling the switch section to bring the second and third voltage lines from a disconnected to connected state; and
   initiating the initial setup of the circuit section during a period from when the held voltage begins to change to when the switch section is controlled.

* * * * *